United States Patent
Park et al.

(10) Patent No.: US 10,458,028 B2
(45) Date of Patent: Oct. 29, 2019

(54) METHOD FOR ELECTROCHEMICAL AMMONIA SYNTHESIS USING SINGLE-CRYSTALLINE METAL CATALYST

(71) Applicant: KOREA INSTITUTE OF SCIENCE AND TECHNOLOGY, Seoul (KR)

(72) Inventors: Jong Hyuk Park, Seoul (KR); Hyun Seo Park, Seoul (KR); Jimin Kong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 18 days.

(21) Appl. No.: 15/846,893

(22) Filed: Dec. 19, 2017

(65) Prior Publication Data

US 2019/0161872 A1 May 30, 2019

(30) Foreign Application Priority Data

Nov. 24, 2017 (KR) .......... 10-2017-0158276

(51) Int. Cl.
| | |
|---|---|
| C25B 11/04 | (2006.01) |
| C25B 1/00 | (2006.01) |
| C25B 11/02 | (2006.01) |
| C30B 29/02 | (2006.01) |
| C30B 23/02 | (2006.01) |
| C30B 33/02 | (2006.01) |

(52) U.S. Cl.
CPC .......... *C25B 11/0473* (2013.01); *C25B 1/00* (2013.01); *C25B 11/02* (2013.01); *C25B 11/0405* (2013.01); *C25B 11/0447* (2013.01); *C30B 23/025* (2013.01); *C30B 29/02* (2013.01); *C30B 33/02* (2013.01)

(58) Field of Classification Search
CPC combination set(s) only.
See application file for complete search history.

(56) References Cited

U.S. PATENT DOCUMENTS

2016/0138176 A1* 5/2016 Yoo .................. C25B 15/08
204/239

FOREIGN PATENT DOCUMENTS

KR 10-2013-0020351 A 2/2013

OTHER PUBLICATIONS

C. Zamfirescu, I. Dincer, "Using ammonia as a sustainable fuel", Journal of Power Sources, 2008, pp. 459-465, vol. 185.
George Marnellos et al., "Ammonia Synthesis at Atmospheric Pressure", Science, Oct. 2, 1998, pp. 98-100, vol. 282.

(Continued)

*Primary Examiner* — Arun S Phasge
(74) *Attorney, Agent, or Firm* — Rabin & Berdo, P.C.

(57) ABSTRACT

An electrochemical method for ammonia synthesis including the steps of: preparing a single-crystalline metal thin film; and synthesizing ammonia by using the single-crystalline metal thin film electrode. More particularly, it relates to improvement of the production yield and synthesis rate of ammonia trough the method for preparing ammonia by using an electrochemical reactor which includes a cathode including a single-crystalline metal thin film on the surface thereof, an anode and an electrolyte, wherein the method includes the steps of: supplying nitrogen to the cathode; supplying aqueous electrolyte solution to the anode; and applying an electric voltage between the cathode and the anode.

7 Claims, 10 Drawing Sheets

(56) References Cited

OTHER PUBLICATIONS

Rong Lan et al., "Synthesis of ammonia directly from air and water at ambient temperature and pressure", Science Reports, Jan. 29, 2013, pp. 1-7, vol. 3, No. 1145.
Elena Pérez-Gallent et al., "Electrocatalytic reduction of Nitrate on Copper single crystals in acidic and alkaline solutions", Electrochimica Acta, 2017, pp. 77-84, vol. 227.

\* cited by examiner

METHOD FOR ELECTROCHEMICAL AMMONIA SYNTHESIS USING SINGLE-CRYSTALLINE METAL CATALYST

CROSS-REFERENCE TO RELATED APPLICATIONS

This application claims, under 35 U.S.C. § 119, the priority of Korean Patent Application No. 1 0-2017-01 58276 filed on Nov. 24, 2017 in the Korean Intellectual Property Office, the disclosure of which is incorporated herein by reference in its entirety.

TECHNICAL FIELD

The following disclosure relates to a method for ammonia synthesis using a single-crystalline metal catalyst. More particularly, the following disclosure relates to application of a single-crystalline metal thin film cathode of silver (Ag), copper (Cu), aluminum (Al), or the like to an electrochemical reactor for ammonia synthesis so that the production yield and synthesis rate of ammonia may be improved through the reaction of nitrogen and protons.

BACKGROUND

To prepare regulation on green gas emission caused by a climate change and exhaust of fossil fuel, some studies about application of ammonia (17.6 wt % $H_2$) that is a hydrogen-storing body to fuel cells, fuel for vehicles, or the like, as a substitute for fuel. Ammonia, a carbon-free energy carrier, is liquefied at 21° C. under 7.86 bar and thus is convenient to store and transport as compared to hydrogen, and emits water and nitrogen only as shown in the following Reaction Scheme 1 upon the complete combustion. In addition, ammonia has a high energy density per volume (HHV $NH_3$: 13.6 $GJ/m^3$) similar to that of fossil fuel (HHV LPG: 19 $GJ/m^3$, HHV CNG: 10.4 $GJ/m^3$) (Non-Patent Document 1).

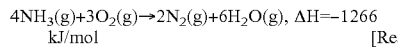
[Reaction Scheme 1]

The most general method for producing ammonia is the Haber-Bosch process using hydrogen and nitrogen as starting materials and carried out under a high pressure (150-250 bar) at a high temperature (400-500° C.) in the presence of an iron or ruthenium catalyst as shown in the following Reaction Scheme 2. The reaction consumes a significantly large amount of energy of about 34.4 GJ/ton $NH_3$ and causes a problem in that it emits a large amount of greenhouse gas corresponding to 1.8 ton $CO_2$/ton $NH_3$ due to the fossil fuel used for supplying the energy.

[Reaction Scheme 2]

To overcome the above-mentioned problem of the Haber-Bosch process, an electrochemical method for ammonia synthesis using an ion conductive oxide electrolyte has been suggested. Active studies have been conducted about an electrochemical method for ammonia synthesis from water and nitrogen using an electrolyte (Non-Patent Document 2).

An electrochemical method for ammonia synthesis undergoes a series of steps as shown in the following Reaction Scheme 3, and includes reaction (3-1) in which water is decomposed at an anode to be divided into protons and electrons and reaction (3-2) in which the protons and electrons reduce nitrogen molecules to produce ammonia. The final products of the electrochemical method for ammonia synthesis merely include ammonia and oxygen, and thus the method avoids carbon emission advantageously.

[Reaction Scheme 3]

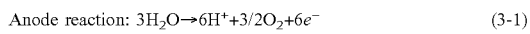  (3-1)

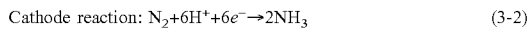  (3-2)

The main limiting reaction in the electrochemical ammonia synthesis reactions is the step of reducing nitrogen molecules into ammonia, which proceeds at the cathode. This results from the dissociation of strong triple bond of a nitrogen molecule. In the cathode reaction, competitive hydrogen-generating reaction occurs instead of nitrogen reduction in the presence of protons. In fact, it is known that the current efficiency is less than 1% when using a water electrolysis-based system (Non-Patent Document 3).

Therefore, according to the present disclosure, a single-crystalline metal is used as a catalyst for electrochemical ammonia synthesis. It has been found that use of the catalyst provides a method for ammonia synthesis having improved ammonia production yield and synthesis rate through the reaction of nitrogen and protons. The present disclosure is based on this finding.

REFERENCES

Non-Patent Documents

1. Zamfirescu, C., and I. Dincer. *Journal of Power Sources* 185.1 (2008): 459-465
2. Marnellos, George, and Michael Stoukides. *Science* 282.5386 (1998): 98-100
3. Lan, Rong, John T S Irvine, and Shanwen Tao. *Scientific Reports* 3 (2013): 1145

SUMMARY

The present disclosure is designed to solve the problems of the related art, and an embodiment of the present disclosure is directed to providing a catalyst for producing ammonia electrochemically with high efficiency by using a single-crystalline metal thin film.

In one aspect of the present disclosure, there is provided an electrochemical reactor for ammonia synthesis which includes a cathode, an anode and an electrolyte, wherein the cathode includes a single-crystalline metal thin film on the surface thereof.

In another aspect of the present disclosure, there is provided a method for preparing a catalyst for electrochemical ammonia synthesis which includes a step of growing a single-crystalline metal epitaxially on a plate-like single-crystalline mica substrate.

In still another aspect of the present disclosure, there is provided a method for preparing ammonia by using an electrochemical reactor which includes a cathode including a single-crystalline metal thin film on the surface thereof, an anode and an electrolyte, the method including the steps of: (A) supplying nitrogen to the cathode; (B) supplying aqueous electrolyte solution to the anode; and (C) applying an electric voltage between the cathode and the anode.

To synthesize ammonia with high efficiency, preferred is a method capable of controlling an electrochemical reaction through a specific crystal surface exposed to the outside, not a randomly aligned conventional metal surface. Particularly, in the case of a metal aligned with a specific crystal surface, it has been reported through the expectation of the related art that the metal shows excellent reaction efficiency with nitrogen molecules.

DETAILED DESCRIPTION OF EMBODIMENTS

Figure 1:
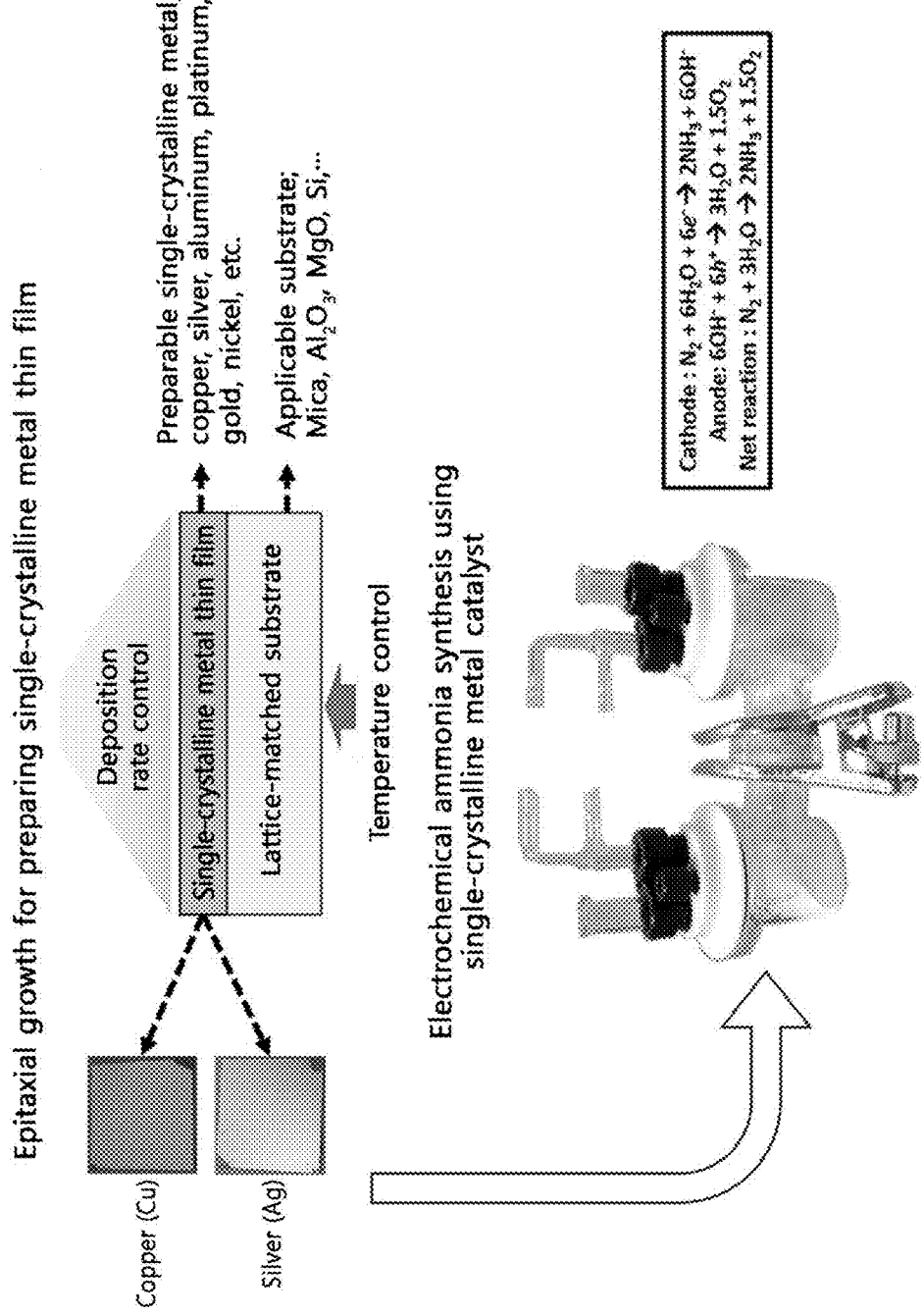
FIG. 1 shows a process for preparing a single-crystalline metal thin film using an epitaxial growing method and a process for electrochemical ammonia synthesis using a single-crystalline metal catalyst.

Hereinafter, various aspects and embodiments of the present disclosure will be explained in more detail.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In one aspect of the present disclosure, there is provided an electrochemical reactor for ammonia synthesis which includes a cathode, an anode and an electrolyte, wherein the cathode includes a single-crystalline metal thin film on the surface thereof.

The present disclosure is applied to a reactor for ammonia synthesis, particularly to an electrochemical reaction that may be carried out at low temperature (100° C. or less) under ambient pressure. In general, such a reaction shows an effect significantly different from the effect of a chemical reaction carried out at high temperature (798 K), it should be noted that an electrode catalyst used for an electrode chemical reaction cannot be derived easily from the catalyst used for a chemical reaction.

Particular examples of the metal include Cu, Ag, Al, Au, Ni, Rh, Pd, Ir, Co, Cr, Fe, Mn, Mo, Nb, Os, Pb, Re, Ru, Ta, Ti, V, W, Zn, or the like, but are not limited thereto. However, it is preferred to use any one selected from Cu, Ag, Al, Au, Ni, Rh, Pd, Fe, Mo, and Ir, or an alloy thereof. It is more preferred to use any one selected from Cu, Ag, Al, Au and Pd, or an alloy thereof.

However, even more preferred examples include Cu, Ag, Al or an alloy of two or more of them. Most preferred examples include Cu, Ag or an alloy thereof.

Therefore, according to an embodiment of the present disclosure, the metal is Cu, Ag or an alloy thereof.

The single-crystalline metal thin film may have a root-mean square roughness of 10 nm or less, particularly 0.1-10 nm, preferably 0.1-3 nm, and more preferably 0.1-1 nm.

Particularly, when the root-mean square roughness is within the above-defined range, most of the surface of the single-crystalline metal thin film exposed to the outside may be limited to a specific crystal surface. Thus, it is possible to control the activity of the single-crystalline metal thin film catalyst in an electrochemical reaction. According to the present disclosure, conditions of growing the single-crystalline metal thin film are controlled so that the surface of the single-crystalline metal thin film may be (111) crystal surface. As a result, it is shown that the efficiency of an electrochemical reaction for ammonia synthesis is improved significantly.

Therefore, according to another embodiment of the present disclosure, the single-crystalline metal thin film has a root-mean square roughness of 0.1-3 mm as analyzed by atomic force microscopy (AFM).

The single-crystalline metal thin film may have a thickness of 10-1,000 nm, preferably 10-500 nm, and most preferably 50-300 nm.

Therefore, according to still another embodiment of the present disclosure, the single-crystalline metal thin film has a thickness of 50-300 nm.

According to still another embodiment of the present disclosure, a single-crystalline metal thin film whose surface mostly includes (111) crystal surface as analyzed by X-ray diffractometry (XRD) is used. It is important to use a single-crystalline metal thin film wherein the other crystal surfaces (100 and 220 surfaces) are not exposed substantially on the surface thereof.

Particular examples of the methods for preparing such a single-crystalline metal thin film include thermal evaporation, sputtering, atomic layer deposition (ALD), pulsed laser deposition (PLD), electron beam evaporation, physical vapor deposition (PVD), chemical vapor deposition (CVD), molecular beam epitaxy (MBE), or the like, but are not limited thereto.

However, according to the present disclosure, thermal evaporation is used preferably. Therefore, in another aspect, there is provided a method for preparing a catalyst for electrochemical ammonia synthesis, including step (B) of growing a single-crystalline metal epitaxially on a plate-like single-crystalline mica substrate.

According to an embodiment of the present disclosure, step (B) is carried out at a deposition temperature of 100-800° C. under a deposition rate of 0.5-10 nm/s, preferably at a deposition temperature of 100-600° C. under a deposition rate of 1-5 nm/s, and more preferably at a deposition temperature of 200-600° C. under a deposition rate of 1-3 nm/s.

According to another embodiment of the present disclosure, the method further includes a step of heat treating the single-crystalline mica substrate, before step (B). When heat treatment is carried out before the metal deposition, it is possible to remove the gas molecules or impurities adsorbed to the substrate, and thus to improve the crystallinity of the single-crystalline metal film and to reduce the root-mean square roughness.

According to still another embodiment, the method further includes, after step (B), step (A) of heating the single-crystalline mica substrate including epitaxially grown single-crystalline metal at the above-defined deposition temperature for 1-60 minutes. When heat treatment is further carried out after the metal deposition, it is possible to improve the crystallinity of the single-crystalline metal film and to reduce the root-mean square roughness.

In still another aspect, there is provided a method for preparing ammonia by using an electrochemical reactor which includes a cathode including a single-crystalline metal thin film on the surface thereof, an anode and an electrolyte, the method including the steps of: (A) supplying nitrogen to the cathode; (B) supplying aqueous electrolyte solution to the anode; and (C) applying an electric voltage between the cathode and the anode.

It is possible to improve the production yield and synthesis rate of ammonia significantly through the electrochemical method for ammonia synthesis according to the present disclosure.

According to an embodiment of the present disclosure, the anode is a titanium or carbon rod coated with at least one oxide of metal selected from iridium, ruthenium and cobalt.

According to another embodiment of the present disclosure, nitrogen is supplied at a rate of 150-250 mL/minute, potassium hydroxide is supplied at a rate of 0.5-5 mL/minute, and the electric potential is applied to cathode at 0.1 to −1.0 V vs. the reference hydrogen generation potential.

According to a preferred embodiment of the present disclosure, (1) the metal is Cu, Ag or an alloy thereof, (2) the root-mean square roughness of the single-crystalline metal thin film is 0.1-1 nm, (3) the single-crystalline metal thin film has a thickness of 50-300 nm, and (4) most of the surface of the single-crystalline metal thin film includes (111) crystal surface and the other crystal surfaces ((100) and (220) surfaces) are not exposed on the surface substantially.

It is shown that when all of the above-mentioned conditions are satisfied, hydrogen formation competing against ammonia synthesis is lowered significantly so that the reaction selectivity may be improved significantly.

According to a more preferred embodiment of the present disclosure, the following conditions are important while conditions (1) to (4) are satisfied: (5) the single-crystalline metal thin film is formed by thermal evaporation; (6) the single-crystalline metal thin film is one grown epitaxially on a plate-like single-crystalline mica substrate through thermal evaporation; (7) the thermal evaporation is carried out at a deposition temperature of 100-600° C. at a deposition rate of 1-3 nm/s; and (8) the single-crystalline mica substrate including the epitaxially grown single-crystalline metal is further heated at the above-defined deposition temperature for 1-60 minutes even after the completion of deposition. When the above-mentioned conditions (1)-(8) are satisfied completely, production of hydrogen caused by side reactions is not changed substantially even when the extent of applied voltage is controlled, which facilitates searching the optimum applied voltage. It is shown that when any one of the above-mentioned conditions is not satisfied, the above-described effects cannot be obtained.

EXAMPLES

The examples and experiments will now be described. The following examples and experiments are for illustrative purposes only and not intended to limit the scope of this disclosure. In addition, it will be apparent to those skilled in the art that the present disclosure can be carried out with ease based on the description, including the examples, of the present disclosure, even though no particular experimental results thereof is not suggested herein, and that various changes and modifications may be made without departing from the spirit and scope of the disclosure as defined in the following claims.

Further, the experimental results described below are merely typical results of the examples and experiments. The effect of each of various embodiments not specified below will be described in detail at the corresponding part.

Example 1

Preparation of Single-Crystalline Cu Film

FIG. 1 shows the flow chart according to Example 1. Hereinafter, Example 1 is described with reference to FIG. 1. The Cu film was grown epitaxially on a mica substrate through thermal evaporation.

First, the mica substrate was cleaved by using a blade and introduced to the vacuum chamber of a thermal evaporator. Air was discharged from the chamber, and then the substrate was heated at 550° C. for 30 minutes to remove the molecules adsorbed on the surface. The substrate was maintained at the same temperature of 550° C. Cu (99.99%) was deposited under about $10^{-6}$ torr at a rate of 1.5 nm/s to a thickness of 200 nm, and then the substrate was further heated at the same temperature for 30 minutes.

Example 2

Preparation of Single-Crystalline Ag Film

A single-crystalline Ag film was prepared in the same manner as Example 1, except that an Ag film, instead of Cu, was deposited at 360° C. at a rate of about 1.6 nm/s.

Example 3

Preparation of Single-Crystalline Al Film

A single-crystalline Al film was prepared in the same manner as Example 1, except that an Al film, instead of Cu, was deposited at 250° C. at a rate of about 2.5 nm/s.

Comparative Example 1

Polycrystalline Cu Film

A polycrystalline Cu film was deposited on a glass substrate through thermal evaporation as described hereinafter. The substrate was maintained at the same temperature (room temperature: ~25° C.) during the deposition. Cu (99.99%) was deposited under about $10^{-6}$ torr at a rate of about 0.2 nm/s to a thickness of 200 nm to obtain a polycrystalline Cu film.

Comparative Example 2

Polycrystalline Ag Film

A polycrystalline Ag film was prepared in the same manner as Comparative Example 1.

Comparative Example 3

Polycrystalline Al Film

A polycrystalline Al film was prepared in the same manner as Comparative Example 1.

Test Example 1

Surface Morphology Observation Using Atomic Force Microscopy (AFM)

The surface shape of the Ag film was observed by an atomic force microscope. AFM images were obtained for a scan area of 2.5×2.5 $\mu m^2$ at a scanning rate of 0.5 Hz by using a tapping mode.

Figure 2A:
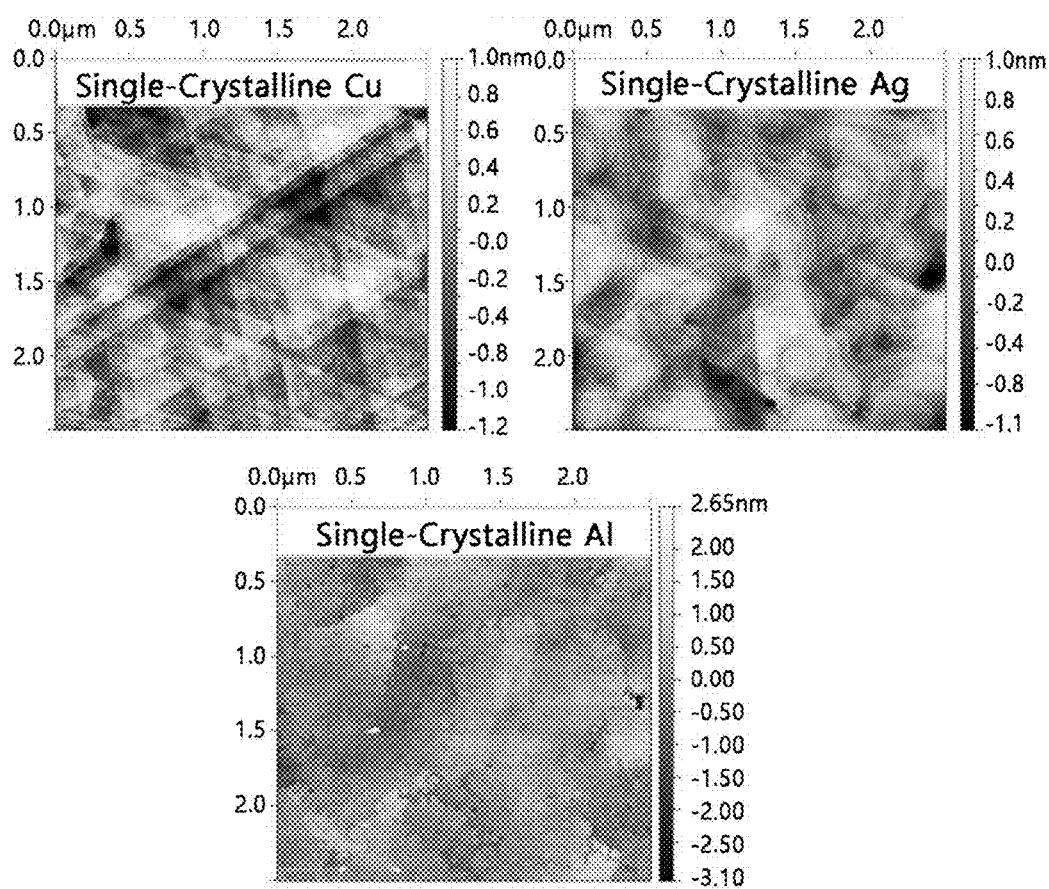
FIG. 2A shows the surface morphology of the Cu, Ag and Al single-crystalline thin films according to Examples 1-3.

FIG. 2A shows the surface morphology of the Cu, Ag and Al single-crystalline thin films according to Examples 1-3, as observed by AFM. Each of Cu, Ag and Al was deposited at the optimized temperature and rate condition to obtain significantly flat thin films as shown in FIG. 2A. Particularly, Cu and Ag show a hexagonal shape of (111) crystal surface, which suggests that well-aligned crystal surfaces are formed in the in-plane direction. It is also shown that Al forms a significantly flat thin film.

Figure 2B:
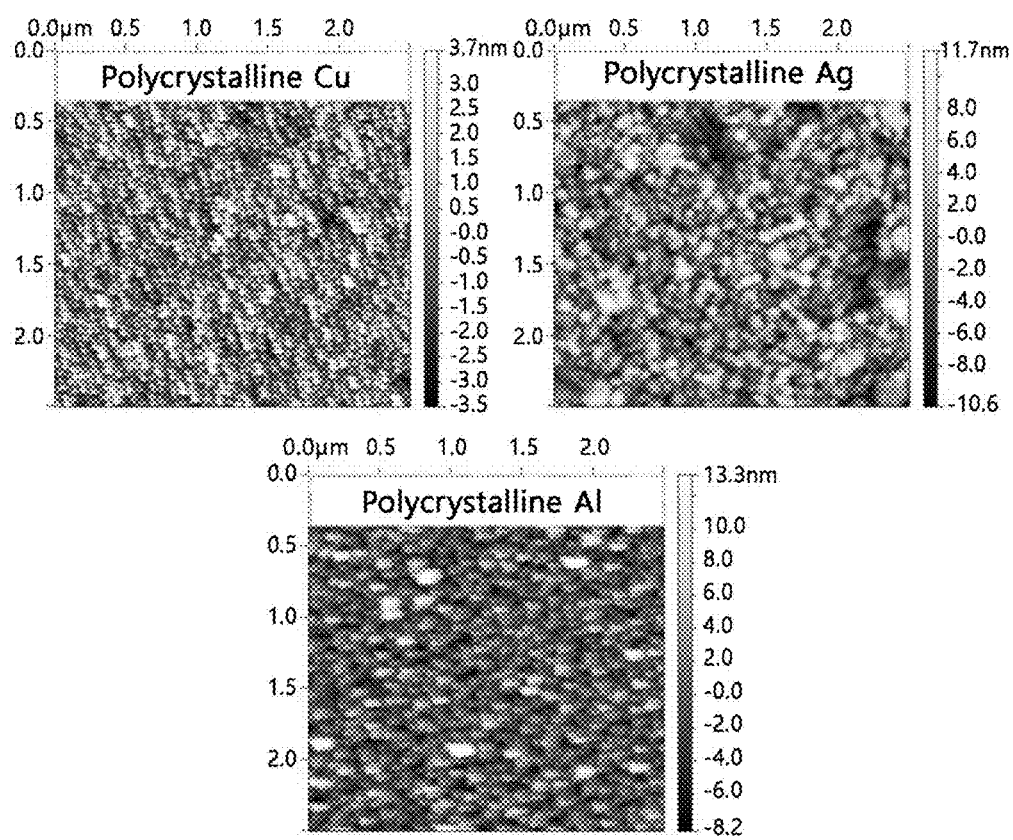
FIG. 2B shows the surface morphology of the Cu, Ag and Al polycrystalline thin films according to Comparative Examples 1-3, as observed by atomic force microscopy (AFM).

Referring to roughness, the Cu thin film has a roughness of 0.32 nm, the Ag thin film has a roughness of 0.43 nm, and the Al thin film has a roughness of 0.54 nm. FIG. 2B shows the surface morphology of the Cu, Ag and Al polycrystalline thin films according to Comparative Examples 1-3, as observed by AFM. While the polycrystalline metal thin films obtained under the conventional deposition conditions at room temperature have a roughness of approximately 3-20 nm, the thin films according to the present disclosure have a significantly smooth surface.

Test Example 2

X-Ray Diffractometry (XRD) Analysis

XRD analysis was carried out to analyze the crystal structure of a single-crystalline thin film.

Figure 3:
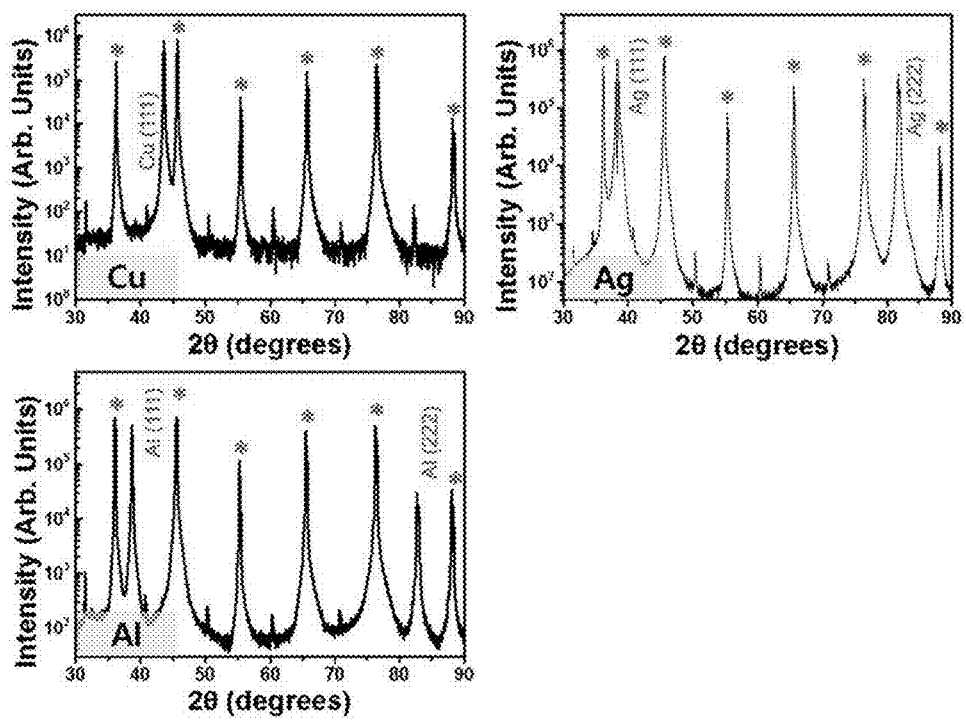
FIG. 3 shows the results of X-ray diffractometry (XRD) (2θ scan) of the Cu, Ag and Al single-crystalline thin films according to Examples 1-3.

FIG. 3 shows the results of X-ray diffractometry (XRD) (2θ scan) of the Cu, Ag and Al single-crystalline thin films according to Examples 1-3. It can be seen from FIG. 3 that metal single crystals are formed. Each of Cu, Ag and Al includes (111) surfaces only and the other surfaces, such as (100) or (220) surfaces, do not appear. Thus, it can be seen that single crystals are formed. Herein, the peaks marked by * are those of the mica substrate.

Figure 4:
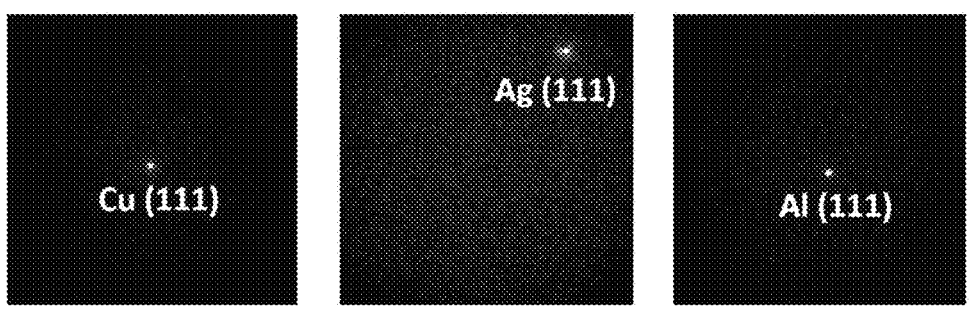
FIG. 4 shows the results of 2D scan based on XRD of the Cu, Ag and Al single-crystalline thin films according to Examples 1-3.

FIG. 4 shows the results of 2D scan based on XRD of the Cu, Ag and Al single-crystalline thin films according to Examples 1-3. In general, various surfaces are present randomly in the case of polycrystalline metal thin films, and thus such polycrystalline metal thin films show circular shapes after 2D scanning. On the contrary, it can be seen from FIG. 4 that the single-crystalline metal thin film according to the present disclosure shows a significantly small dot after 2D scanning, which demonstrates formation of single crystals.

Figure 5:
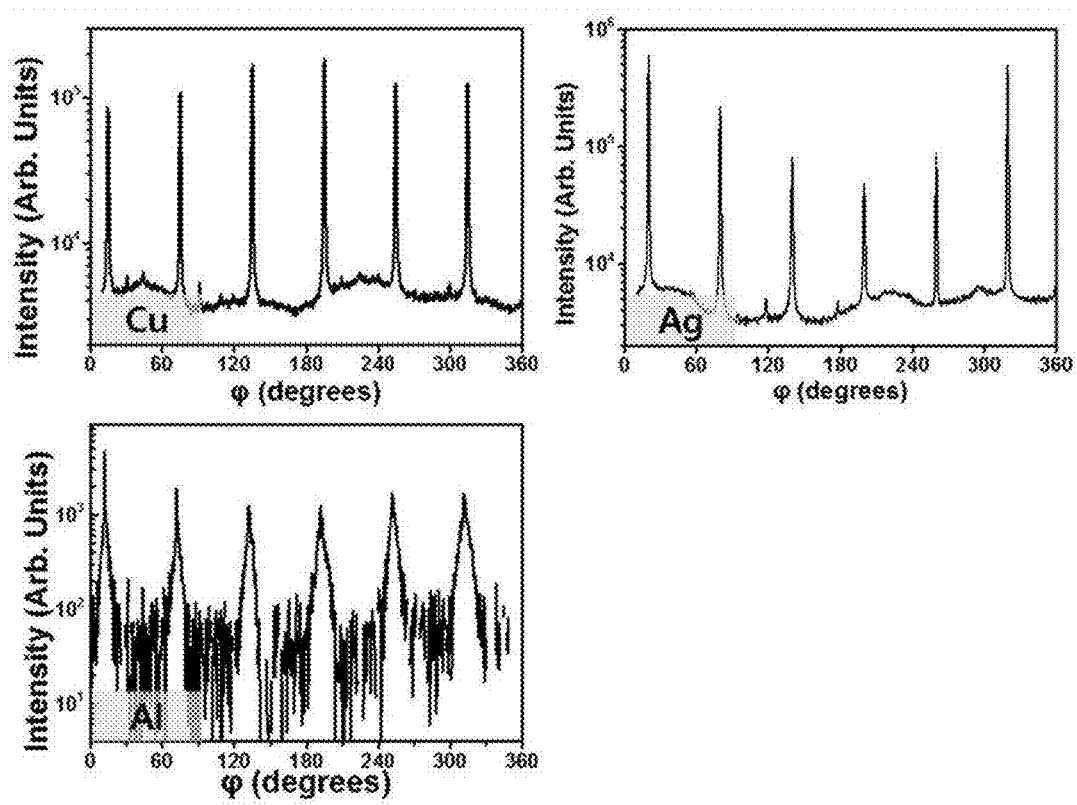
FIG. 5 shows the results of φ scan based on XRD of the Cu, Ag and Al single-crystalline thin films according to Examples 1-3.

FIG. 5 shows the results of φ scan based on XRD of the Cu, Ag and Al single-crystalline thin films according to Examples 1-3. When a substrate is scanned in XRD after it is rotated by 360°, it is possible to identify the symmetry of a material. It can be seen from FIG. 5 that (111) surface of face-centered cubic (FCC) metal has six-fold symmetry which can be determined by six sharp peaks. However, the Al thin film shows a relatively broad peak but the other peaks cannot be observed between the peaks. Thus, it is though that the other surfaces are not present.

The single-crystalline metal according to Example 1 and the polycrystalline metal according to Comparative Example 1 were used to carry out electrochemical ammonia synthesis. Each of the single-crystalline Cu and polycrystalline Cu was used as a cathode and an iridium oxide-coated titanium or carbon rod was used as an anode. Both electrodes were positioned in an electrolyte and electric potential was applied thereto to synthesize ammonia electrochemically.

Nitrogen ($N_2$) was allowed to flow in the electrolyte solution in which the cathode is located at 200 mL/minute. Then, different potentials were applied to the electrode and the product was collected in sulfuric acid at an interval of 1 hour. After that, ultraviolet-visible spectrometry was carried out to determine whether ammonia was generated or not.

Cyclic voltammetry (CV) and chronoamperometry (CA) were used to carry out an electrochemical property test. Particularly, the CV test was carried out at a scanning rate of 20 mV/sec in a scanning range of 0.2V to −0.6V (vs. hydrogen generation potential).

Figure 6A:
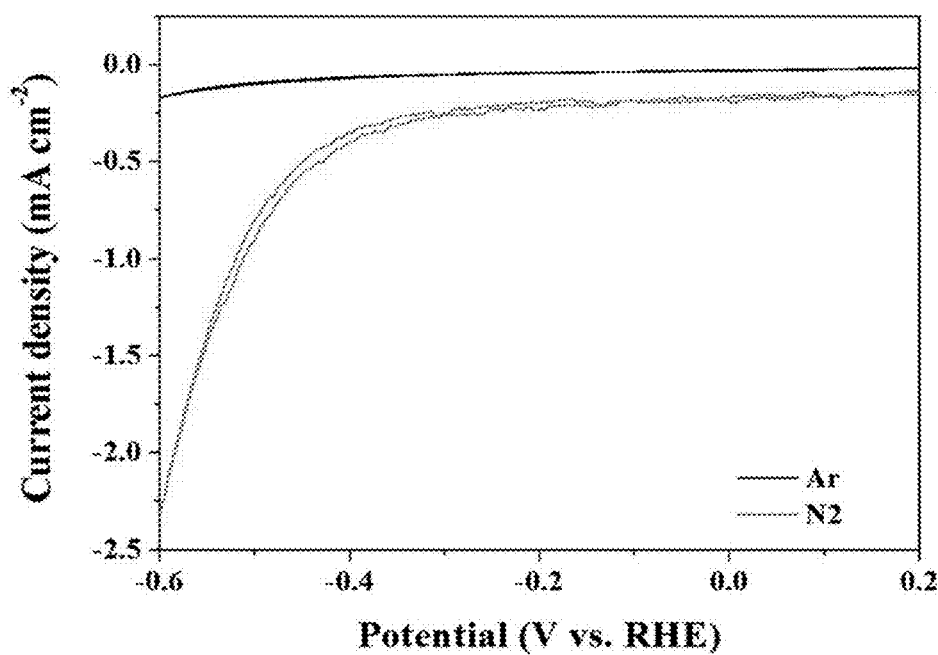
FIG. 6A shows a graph illustrating the results of cyclic voltammetry (CV) and FIG. 6B shows a graph illustrating the results of chronoamperometry (CA) of the electrochemical method for ammonia synthesis using the single-crystalline Cu according to Example 1.
Figure 6B:
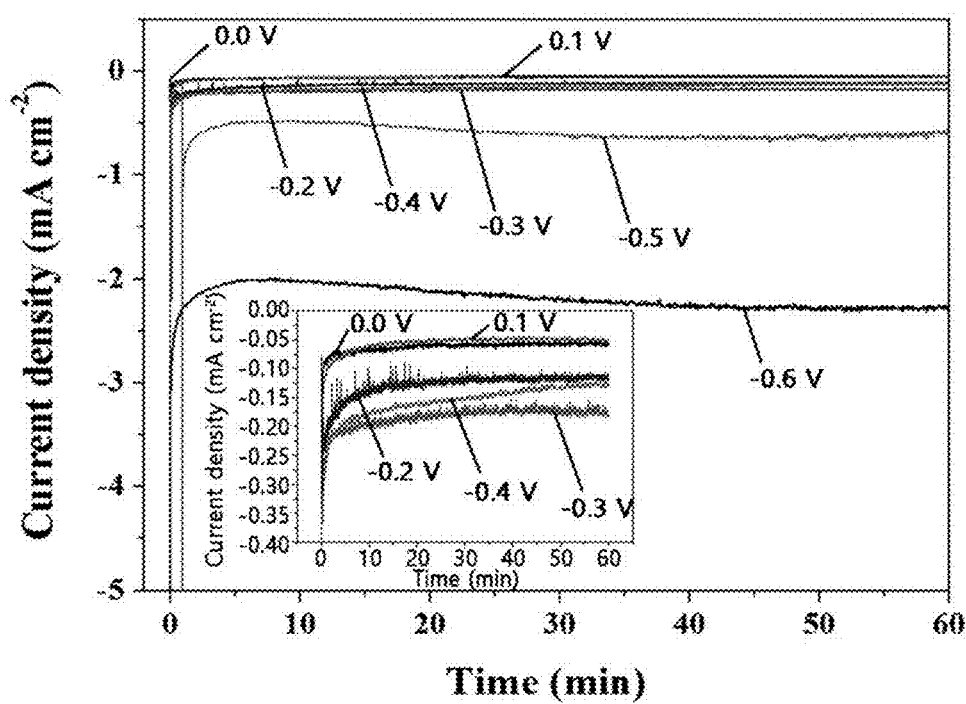

FIG. 6A shows a graph illustrating the results of cyclic voltammetry (CV) and FIG. 6B shows a graph illustrating the results of chronoamperometry (CA) of the electrochemical method for ammonia synthesis using the single-crystalline Cu according to Example 1.

Figure 7A:
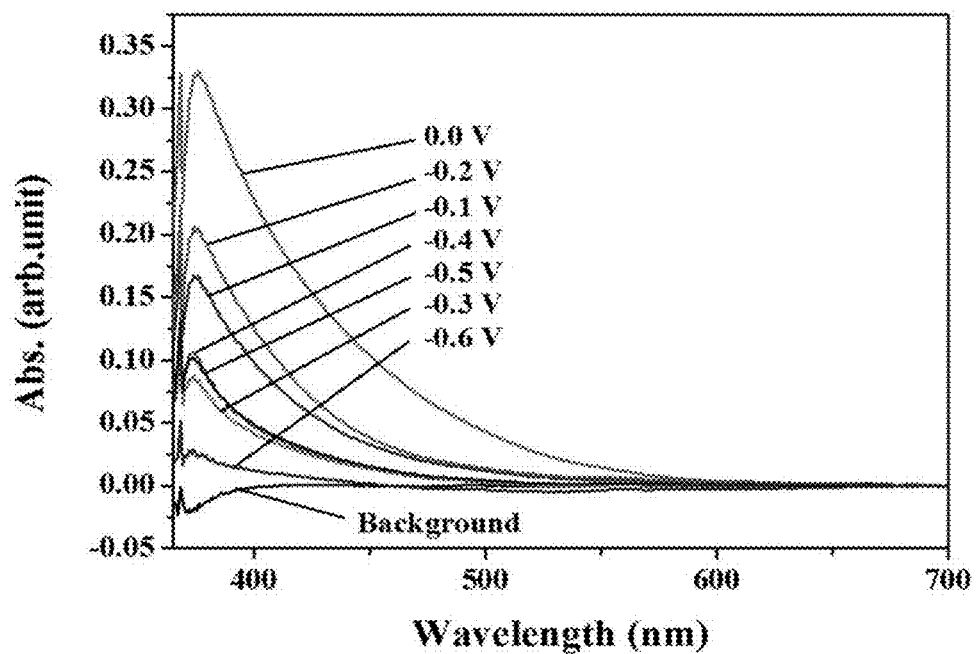
FIG. 7A shows a graph illustrating the results of ultraviolet-visible spectrophotometry of the resultant ammonia as detected by the Nessler's method.
Figure 7B:
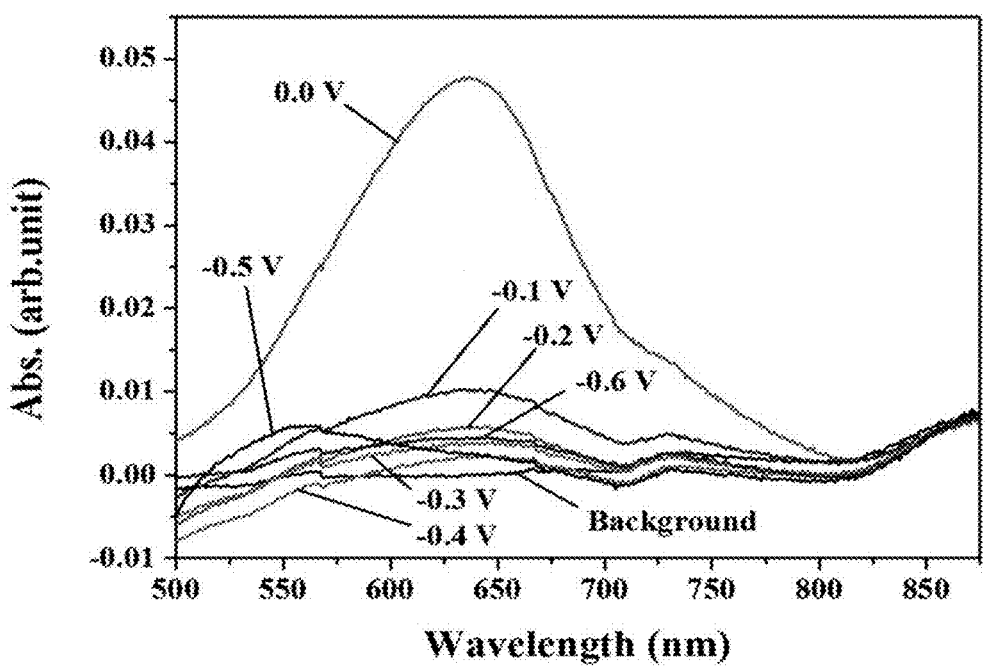
FIG. 7B shows a graph illustrating the results of ultraviolet-visible spectrophotometry of the resultant ammonia as detected by the indophenol method for the electrochemical method for ammonia synthesis using the single-crystalline Cu according to Example 1.

FIG. 7A shows a graph illustrating the results of ultraviolet-visible spectrophotometry of the resultant ammonia as detected by the Nessler's method, and FIG. 7B shows a graph illustrating the results of ultraviolet-visible spectrophotometry of the resultant ammonia as detected by the indophenol method for the electrochemical method for ammonia synthesis using the single-crystalline Cu according to Example 1.

It can be seen from FIGS. 7A and 7B that ammonia is generated at a potential ranging from 0.0V to −0.6V.

Figure 8A:
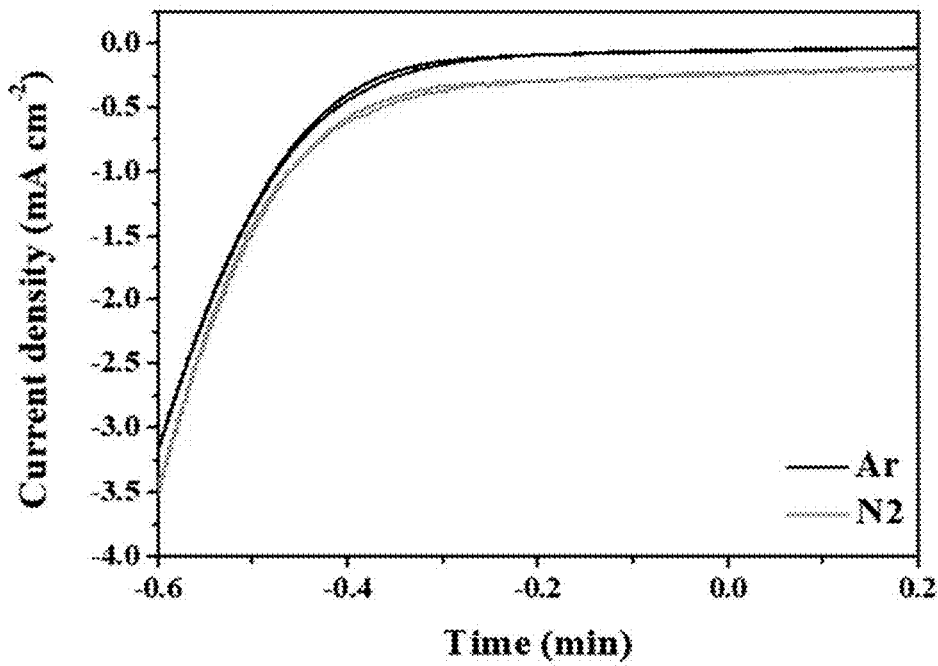
FIG. 8A shows a graph illustrating the results of cyclic voltammetry (CV) and FIG. 8B shows a graph illustrating the results of chronoamperometry (CA) of the electrochemical method for ammonia synthesis using the single-crystalline Ag thin film according to Example 2.
Figure 8B:
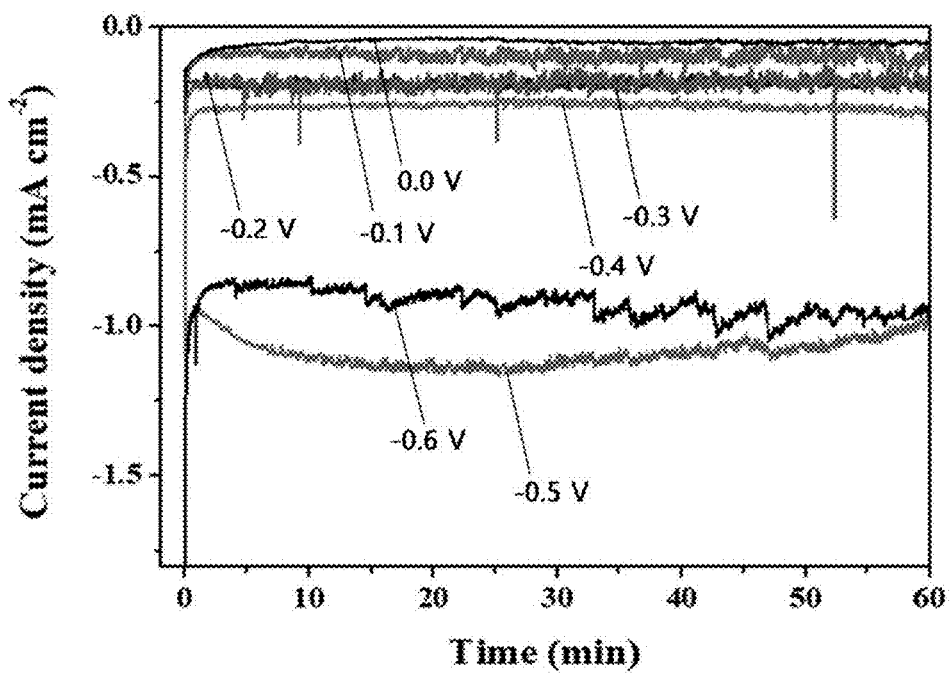

FIG. 8A shows a graph illustrating the results of cyclic voltammetry (CV) and FIG. 8B shows a graph illustrating the results of chronoamperometry (CA) of the electrochemical method for ammonia synthesis using the single-crystalline Ag thin film according to Example 2.

Figure 9A:
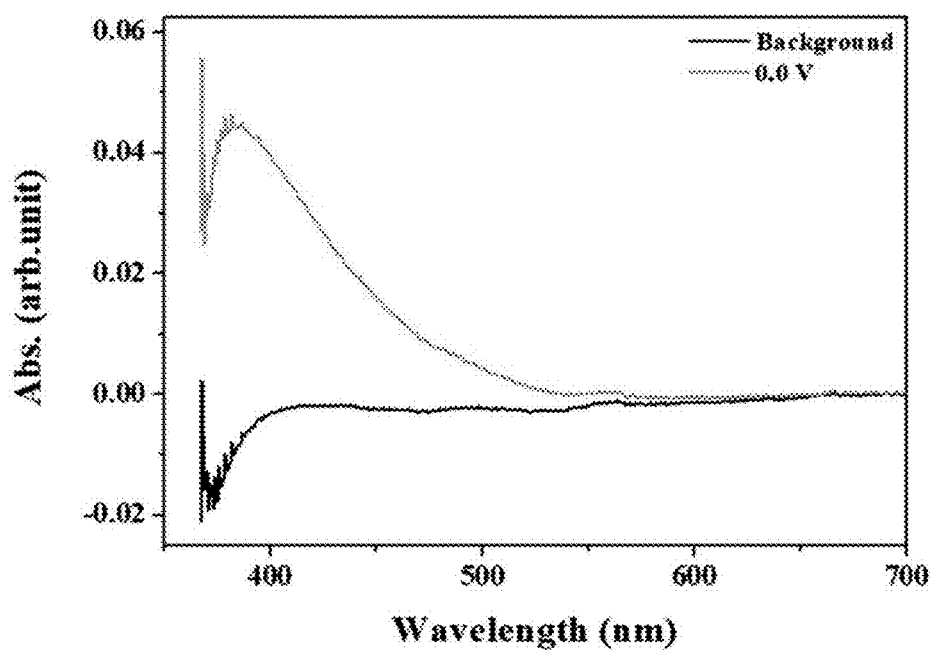
FIG. 9A shows a graph illustrating the results of ultraviolet-visible spectrophotometry of the resultant ammonia as detected by the Nessler's method.
Figure 9B:
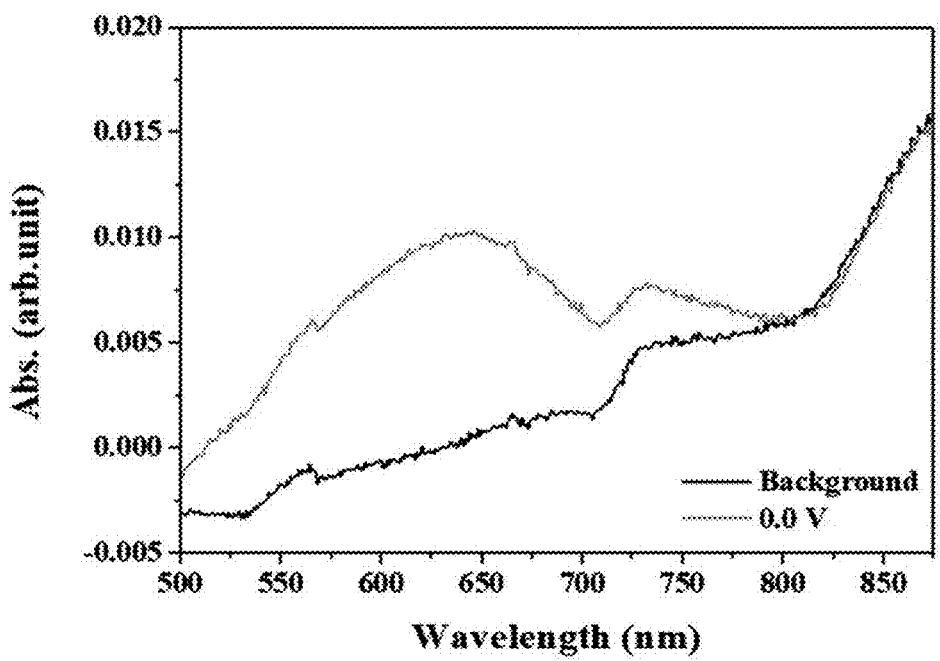
FIG. 9B shows a graph illustrating the results of ultraviolet-visible spectrophotometry of the resultant ammonia as detected by the indophenol method for the electrochemical method for ammonia synthesis using the single-crystalline Ag thin film according to Example 2.

FIG. 9A shows a graph illustrating the results of ultraviolet-visible spectrophotometry of the resultant ammonia as detected by the Nessler's method, and FIG. 9B shows a graph illustrating the results of ultraviolet-visible spectrophotometry of the resultant ammonia as detected by the indophenol method for the electrochemical method for ammonia synthesis using the single-crystalline Ag thin film according to Example 2. It can be seen from FIGS. 9A and 9B that ammonia is generated at 0.0V.

Figure 10A:
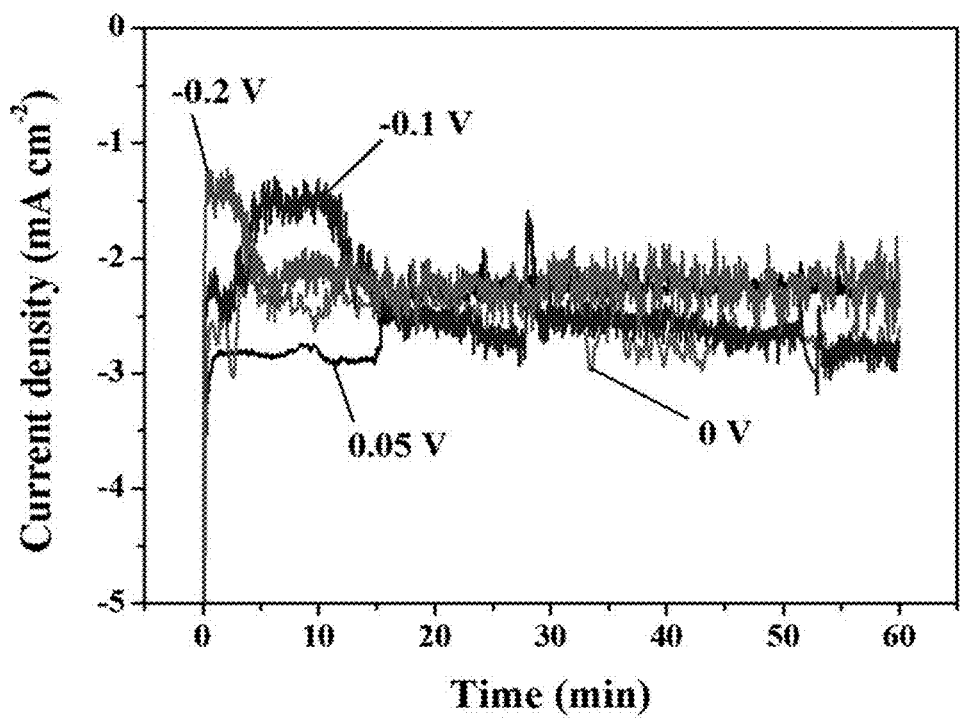
FIG. 10A shows a graph illustrating the results of chronoamperometry (CA)
Figure 10B:
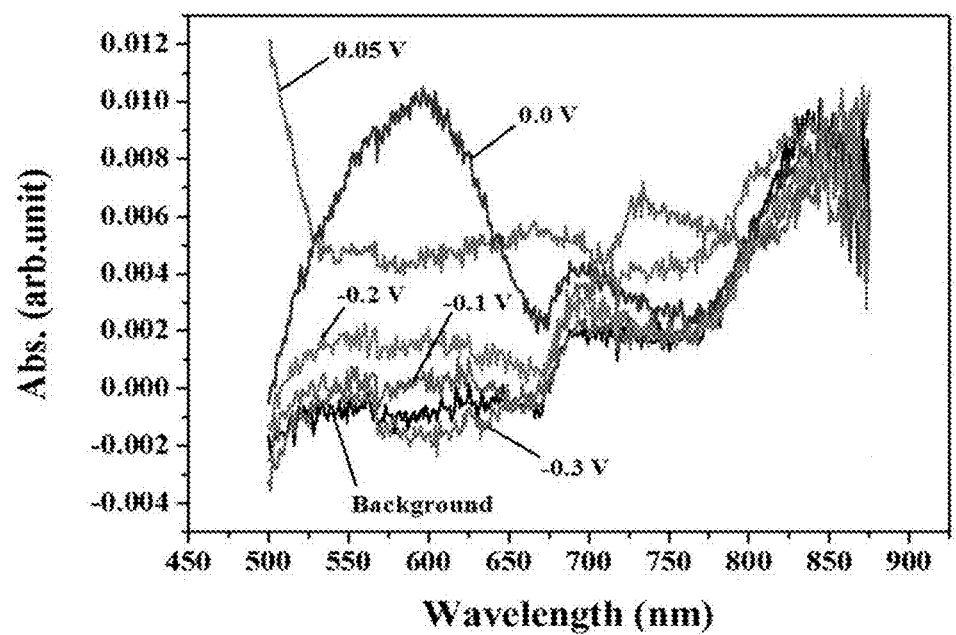
FIG. 10B shows a graph illustrating the results of ultraviolet-visible spectrophotometry of the resultant ammonia as detected by the indophenol method for the electrochemical method for ammonia synthesis using the polycrystalline Cu thin film according to Comparative Example 1.

FIG. 10A shows a graph illustrating the results of chronoamperometry (CA), and FIG. 10B shows a graph illustrating the results of ultraviolet-visible spectrophotometry of the resultant ammonia as detected by the indophenol method for the electrochemical method for ammonia synthesis using the polycrystalline Cu thin film according to Comparative Example 1. It can be seen from FIGS. 10A and 10B that a trace amount of ammonia is generated at a potential of 0.0V but no ammonia is generated at −0.1V, −0.2V and −0.3V.

Referring to FIGS. 7A, 7B, 9A, 9B, 10A, and 10B, the Cu and Ag thin films according to Examples 1 and 2 have an ammonia synthesis efficiency corresponding to a Faraday efficiency of 5%-70%, while the polycrystalline Cu thin film according to Comparative Example 1 has a low Faraday efficiency of 1% or less.

In addition, it can be seen that the single-crystalline Al thin film according to Example 3 shows an ammonia synthesis efficiency corresponding to a Faraday efficiency of 5%-20%, while the polycrystalline Ag and Al thin films according to Comparative Examples 2 and 3 have a low Faraday efficiency of 1% or less.

While the present disclosure has been described with respect to the specific embodiments, it will be apparent to those skilled in the art that various changes and modifications may be made through the addition, change, elimination or supplement of a constitutional element without departing from the spirit and scope of the disclosure as defined in the following claims.

What is claimed is:

1. An electrochemical reactor for ammonia synthesis which comprises a cathode, an anode and an electrolyte,
    wherein the cathode comprises a single-crystalline metal thin film on the surface thereof,
    wherein the metal is Cu, Ag or an alloy thereof,
    wherein the single-crystalline metal thin film has a root-mean square roughness of 0.1-1 nm, as analyzed by atomic force microscopy (AFM),
    wherein the single-crystalline metal thin film has a thickness of 50-300 nm, and
    wherein most of the surface of the single-crystalline metal thin film comprises (111) crystal surface and other (100) and (220) crystal surfaces are not substantially exposed on the surface.

2. The electrochemical reactor for ammonia synthesis according to claim 1, wherein only (111) crystal surfaces are observed in the single-crystalline metal thin film, after analyzing the film by X-ray diffractometry (XRD) in a specific direction.

3. A method for preparing a catalyst for electrochemical ammonia synthesis, comprising a step of growing a single-crystalline metal epitaxially on a plate-shaped single-crystalline mica substrate,
    wherein the catalyst comprises a cathode comprising a single-crystalline metal thin film on the surface thereof, the metal is Cu, Aq or an alloy thereof, the the single-crystalline metal thin film has a root-mean square roughness of 0.1-1 nm as analyzed by atomic force microscopy (AFM), the single-crystalline metal thin film has a thickness of 50-300 nm, and most of the surface of the single-crystalline metal thin film includes (111) crystal surface and other (100) and (220) crystal surfaces are not substantially exposed on the surface;
    wherein the single-crystalline metal thin film is formed by thermal evaporation,
    wherein the single-crystalline metal thin film is grown epitaxially on a plate-shaped single-crystalline mica substrate through thermal evaporation,
    wherein the thermal evaporation is carried out at a deposition temperature of 100-600° C. at a deposition rate of 1-3 nm/s,
    wherein the single-crystalline mica substrate and the epitaxially grown single-crystalline metal thin film is further heated at a deposition temperature of 100-600° C. for 1-60 minutes after completion of deposition.

4. The method for preparing a catalyst for electrochemical ammonia synthesis according to claim 3, further comprising a step of heat treating the single-crystalline mica substrate, before the step of growing the single-crystalline metal.

5. A method for preparing ammonia by using an electrochemical reactor which comprises a cathode comprising a single-crystalline metal thin film on the surface thereof, an anode and an electrolyte, the method comprising the steps of:
    (A) supplying nitrogen to the cathode;
    (B) supplying aqueous electrolyte solution to the anode; and
    (C) applying an electric voltage between the cathode and the anode,
    wherein the metal is Cu, Aq or an alloy thereof,
    wherein the the single-crystalline metal thin film has a root-mean square roughness of 0.1-1 nm, as analyzed by atomic force microscopy (AFM),
    wherein the single-crystalline metal thin film has a thickness of 50-300 nm, and
    wherein most of the surface of the single-crystalline metal thin film comprises (111) crystal surface and other (100) and (220) crystal surfaces are not substantially exposed on the surface.

6. The method for preparing ammonia by using an electrochemical reactor according to claim 5, wherein the anode is a titanium or carbon rod coated with at least one oxide of metal selected from iridium, ruthenium and cobalt.

7. The method for preparing ammonia by using an electrochemical reactor according to claim 5,
    wherein nitrogen is supplied to the cathode at a rate of 150-250 mL/minute,
    aqueous electrolyte solution is supplied to the anode at a rate of 0.5-5 mL/minute, and
    an electric potential is applied to the cathode at 0.1 to −1.0 V vs. a reference hydrogen generation potential.

* * * * *